(12) United States Patent
Höppel et al.

(10) Patent No.: US 8,860,063 B2
(45) Date of Patent: Oct. 14, 2014

(54) LIGHT-EMITTING DIODE CHIP

(75) Inventors: Lutz Höppel, Alteglofsheim (DE); Karl Engl, Pentling-Niedergebraching (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 39 days.

(21) Appl. No.: 13/813,934

(22) PCT Filed: Jul. 25, 2011

(86) PCT No.: PCT/EP2011/062745
§ 371 (c)(1),
(2), (4) Date: Mar. 15, 2013

(87) PCT Pub. No.: WO2012/016874
PCT Pub. Date: Feb. 9, 2012

(65) Prior Publication Data
US 2013/0187183 A1 Jul. 25, 2013

(30) Foreign Application Priority Data
Aug. 3, 2010 (DE) .......................... 10 2010 033 137

(51) Int. Cl.
| | | |
|---|---|---|
| H01L 33/00 | (2010.01) | |
| H01L 33/60 | (2010.01) | |
| H01L 33/52 | (2010.01) | |
| H01L 33/38 | (2010.01) | |
| H01L 33/44 | (2010.01) | |
| H01L 33/22 | (2010.01) | |
| H01L 33/40 | (2010.01) | |

(52) U.S. Cl.
CPC ......... *H01L 33/52* (2013.01); *H01L 2933/0016* (2013.01); *H01L 33/44* (2013.01); *H01L 33/60* (2013.01); *H01L 33/22* (2013.01); *H01L 33/405* (2013.01); *H01L 33/382* (2013.01);

USPC ............................................................ 257/98

(58) Field of Classification Search
CPC ................... H01I 33/52; H01I 33/60
USPC ............................................................ 257/98
See application file for complete search history.

(56) References Cited

U.S. PATENT DOCUMENTS 7,372,078 B2 * 5/2008 Jang et al. ........................ 257/98
8,283,191 B2 * 10/2012 Rode et al. ...................... 438/29

(Continued)

FOREIGN PATENT DOCUMENTS

DE 10 2004 012 219 A1 6/2005
DE 10 2007 022 947 A1 10/2008

(Continued)

*Primary Examiner* — Bilkis Jahan
(74) *Attorney, Agent, or Firm* — McDermott Will & Emery LLP

(57) ABSTRACT

A light-emitting diode chip is specified, comprising
an n-conducting region (1),
a p-conducting region (2),
an active region (3) between the n-conducting region (1) and the p-conducting region (2),
a mirror layer (4) at that side of the p-conducting region (2) which is remote from the active region (3),
an encapsulation layer (5) at that side of the mirror layer (4) which is remote from the p-conducting region (2), and
a contact layer (6) at a side of the encapsulation layer (5) which is remote from the mirror layer (4), wherein
the encapsulation layer (5) extends along a bottom area (43) of the mirror layer (4) which is remote from the p-conducting region (2) and a side area (42) of the mirror layer (4) which runs transversely with respect to the bottom area (43), and
the contact layer (6) is freely accessible in places from its side facing the n-conducting region (1).

13 Claims, 6 Drawing Sheets

(56) References Cited

U.S. PATENT DOCUMENTS

Figure 1G:
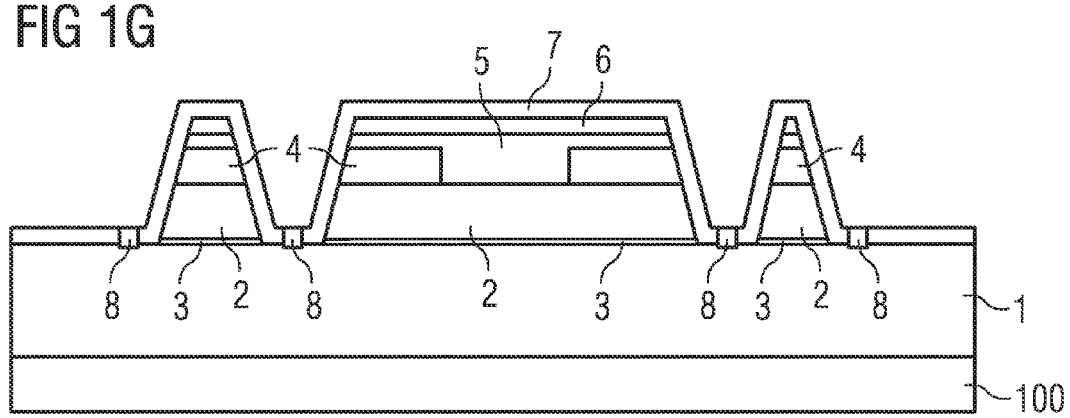

| | | |
|---|---|---|
| 8,482,018 B2 * | 7/2013 | Kang et al. .................. 257/98 |
| 2005/0056855 A1 * | 3/2005 | Lin et al. .................... 257/98 |
| 2007/0290215 A1 | 12/2007 | Kato et al. |
| 2008/0128731 A1 | 6/2008 | DenBaars et al. |
| 2008/0237622 A1 | 10/2008 | Choi et al. |
| 2010/0171135 A1 | 7/2010 | Engl et al. |
| 2011/0049730 A1 * | 3/2011 | Schmid et al. ............. 257/787 |
| 2011/0104836 A1 * | 5/2011 | Rode et al. ................. 438/29 |

FOREIGN PATENT DOCUMENTS

| | | |
|---|---|---|
| DE | 10 2008 012 407 A1 | 8/2009 |
| DE | 10 2008 030 584 A1 | 12/2009 |
| DE | 10 2008 051 048 A1 | 4/2010 |
| DE | 10 2009 022 966 A1 | 12/2010 |
| DE | 10 2010 024 079 A1 | 12/2011 |
| JP | 2006-269807 A | 10/2006 |
| TW | 200903863 A | 1/2009 |
| WO | 2009/045082 A2 | 4/2009 |

* cited by examiner

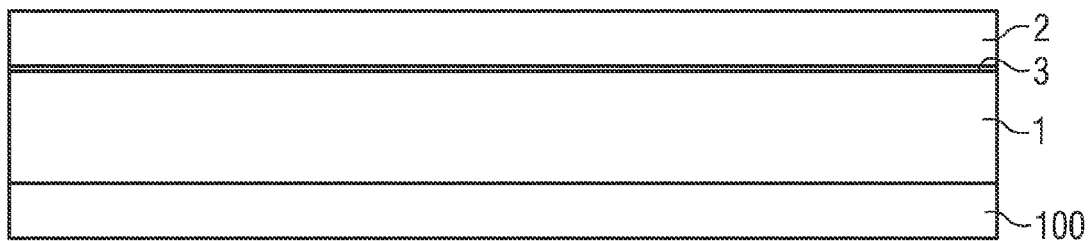
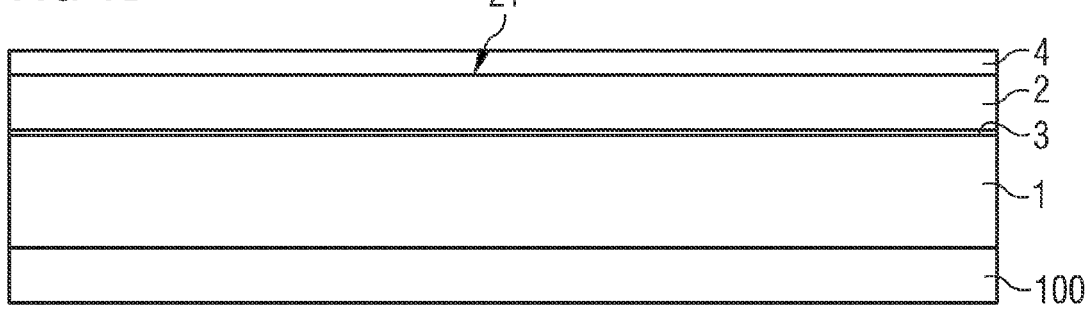
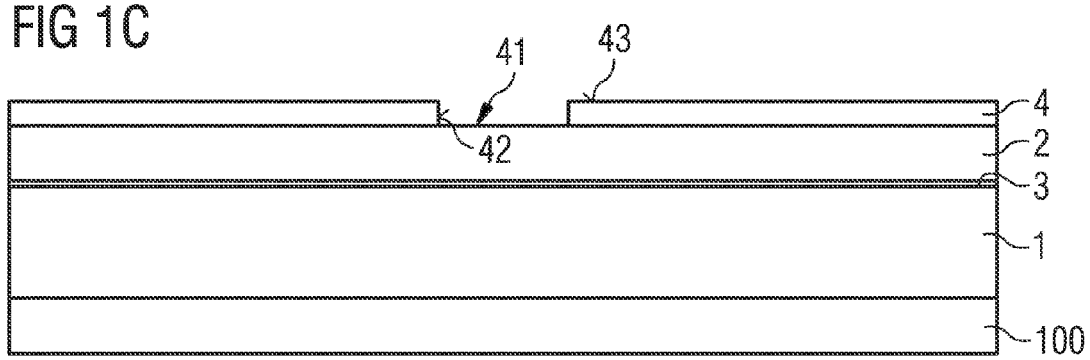

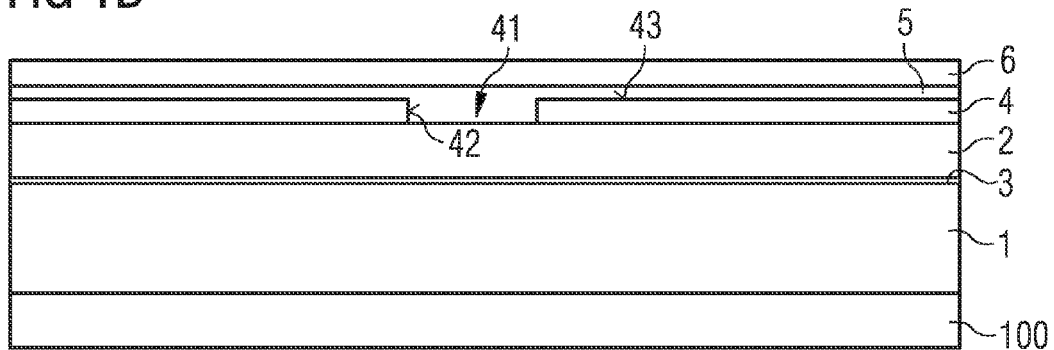
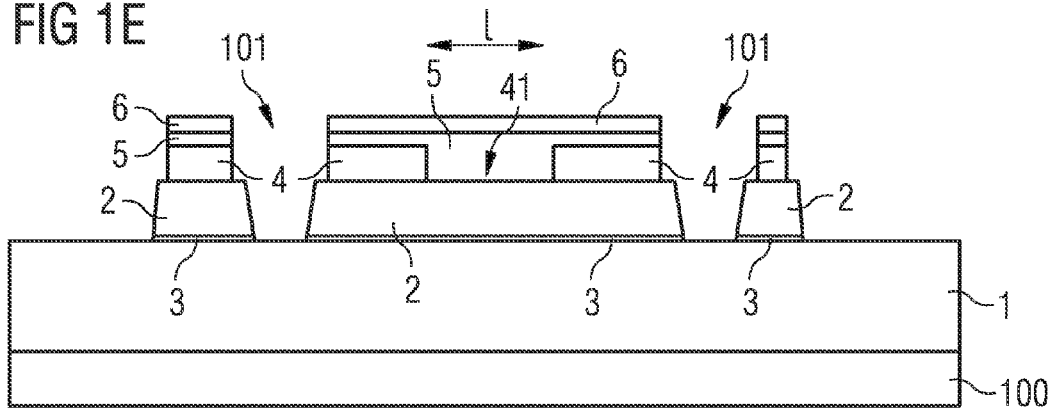
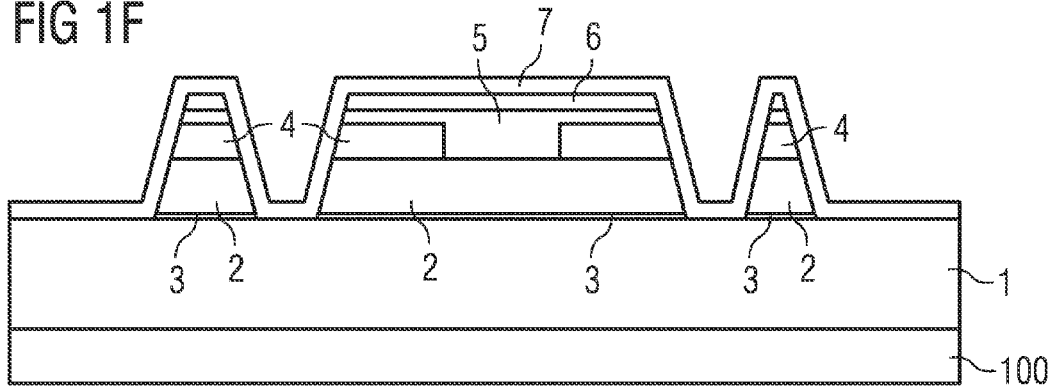

LIGHT-EMITTING DIODE CHIP

A light-emitting diode chip is specified.

The document US 2007/0290215 A1 describes a light-emitting diode chip.

One object to be achieved consists in specifying a light-emitting diode chip which is particularly stable in respect of aging.

In accordance at least one embodiment of the light-emitting diode chip, the light-emitting diode chip comprises an n-conducting region, a p-conducting region and an active region, which is arranged between the n-conducting region and the p-conducting region.

The n-conducting region and the p-conducting region are formed for example by correspondingly doped semiconductor regions. The active region is provided in operation of the light-emitting diode chip for generating electromagnetic radiation for example from the wavelength range of infrared radiation to UV radiation. For this purpose, the active region can comprise for example a pn junction, a single quantum well structure or a multiple quantum well structure. Furthermore, it is possible for the active region to comprise a plurality of radiation-generating layers.

The light-emitting diode chip, that is to say for example the n-conducting region, the p-conducting region and/or the active region, are based for example on a nitride semiconductor. That means that the regions or at least parts of the regions comprise a nitride compound semiconductor material such as $Al_nGa_mIn_{1-n-m}N$ or consist of said material, where it holds true that: $0 \leq n \leq 1$, $0 \leq m \leq 1$ and $n+m \leq 1$. In this case, said material need not necessarily have a mathematically exact composition according to the above formula. Rather, it can comprise for example one or a plurality of dopants and additional constituents.

In accordance with at least one embodiment of the light-emitting diode chip, the light-emitting diode chip comprises a mirror layer, which is arranged at that side of the p-conducting region which is remote from the active region. The mirror layer can for example directly adjoin the p-conducting region. The mirror layer is provided for reflecting electromagnetic radiation generated in the active region during the operation of the light-emitting diode chip in a direction of the n-conducting region.

In accordance with at least one embodiment of the light-emitting diode chip, the light-emitting diode chip comprises an encapsulation layer at that side of the mirror layer which is remote from the p-conducting region. The encapsulation layer can be in direct contact with the mirror layer. The encapsulation layer serves as a barrier for the mirror layer and inhibits or prevents for example the penetration of moisture into the mirror layer. Alternatively or additionally, the encapsulation layer can be suitable for preventing the diffusion of material with which the mirror layer is formed into the p-conducting region, for example.

In accordance with at least one embodiment of the light-emitting diode chip, the light-emitting diode chip comprises a contact layer, which is arranged at a side of the encapsulation layer which is remote from the mirror layer. The contact layer can be for example in direct contact with the encapsulation layer.

In accordance with at least one embodiment of the light-emitting diode chip, the encapsulation layer extends along a bottom area of the mirror layer which is remote from the p-conducting region and a side area of the mirror layer which runs transversally, for example perpendicularly, with respect to the bottom area. In this case, the encapsulation layer can be in direct contact with the mirror layer. Particularly in the region of the side area, the encapsulation layer can completely cover the mirror layer.

In accordance with at least one embodiment of the light-emitting diode chip, the contact layer is freely accessible in places from its side facing the n-conducting region. That is to say that, in particular, the encapsulation layer does not cover the contact layer in places, such that the contact layer can be directly electrically contact-connected from outside the light-emitting diode chip. The contact-connection can be effected from a direction of the n-conducting region, for example by means of a contact-connecting wire, which can be fixed to the contact layer.

In accordance with at least one embodiment of the light-emitting diode chip, the light-emitting diode chip comprises an n-conducting region, a p-conducting region and an active region, which is arranged between the n-conducting region and the p-conducting region. Furthermore, the light-emitting diode chip comprises a mirror layer at that side of the p-conducting region which is remote from the active region, an encapsulation layer at that side of the mirror layer which is remote from the p-conducting region, and a contact layer at a side of the encapsulation layer which is remote from the mirror layer. In this case, the encapsulation layer extends along a bottom area of the mirror layer which is remote from the p-conducting region and a side area of the mirror layer which runs transversely with respect to the bottom area, and the contact layer is freely accessible in places from its side facing the n-conducting region.

In accordance with at least one embodiment of the light-emitting diode chip, the light-emitting diode chip comprises an opening extending through the n-conducting region, the p-conducting region, the active region, the mirror layer and the encapsulation layer as far as the contact layer. In this case, the opening can be introduced into said regions and layers by means of etching, for example.

The opening completely penetrates through the light-emitting diode chip proceeding from the n-conducting region as far as the contact layer. By means of the opening, the contact layer is uncovered and thus freely accessible in places from its side facing the n-conducting region. In this case, the opening can be situated in an edge region of the light-emitting diode chip, such that it is not completely delimited by the n-conducting region, by the p-conducting region, by the active region, by the mirror layer and by the encapsulation layer in a lateral direction. In this case, the lateral direction is that direction which runs parallel to a main extension plane of the light-emitting diode chip.

However, it is also possible for the opening to be arranged in a central region of the light-emitting diode chip, such that the opening is surrounded in a lateral direction on all sides by the n-conducting region, by the p-conducting region, by the active region, by the mirror layer and by the encapsulation layer.

In accordance with at least one embodiment of the light-emitting diode chip, the side area of the mirror layer which faces the opening is completely covered by the encapsulation layer. Through the opening, which also extends through the mirror layer, side areas of the mirror layer would be uncovered in the opening if the encapsulation layer did not extend along said side areas.

In accordance with at least one embodiment of the light-emitting diode chip, the p-conducting layer projects beyond the mirror layer in the region of the opening in the lateral direction. That is to say that the mirror layer does not terminate flush with the p-conducting layer for example in the opening, but rather is pulled back in comparison with the p-conducting layer. The cavity thereby produced—for example a hollow groove—, which is established as a result of the overhang of the p-conducting layer beyond the mirror layer, is preferably completely filled with the material of the encapsulation layer. In the region of the overhang, therefore, the encapsulation layer can directly adjoin the bottom area of the p-conducting region which faces the contact layer. For example, the encapsulation layer in the opening projects beyond the p-conducting layer in the lateral direction.

In accordance with at least one embodiment of the light-emitting diode chip, the contact layer is wire-contact-connectable in places in the region of the opening. That is to say that the opening is embodied with a size such that a wire contact-connection to the contact layer can be effected in the opening for example by means of "wire bonding". The contact layer is formed with a wire-contact-connectable material. The contact layer contains or consists of, for this purpose, for example, one of the following materials: Al, Au.

In accordance with at least one embodiment of the light-emitting diode chip, the light-emitting diode chip comprises a radiation passage area, which is formed in places by an outer area of the n-conducting region which is remote from the p-conducting region. At least part of the electromagnetic radiation emitted by the light-emitting diode chip during operation passes through said radiation passage area before its emergence from the light-emitting diode chip or during its emergence from the light-emitting diode chip. In this case, a current distribution for energizing the active region during operation of the light-emitting diode chip is effected below the radiation passage area.

That is to say that, in other words, no current distribution tracks provided for distributing an electric current as uniformly as possible over the n-conducting region are situated on the radiation passage area, that is to say at the outer area of the n-conducting region. Rather, in the present case, such current distribution structures are formed below the radiation passage area, such that no radiation-absorbing, current-distributing structures are arranged on the radiation passage area. The light-emitting diode chip is thereby distinguished by an improved efficiency. Furthermore, for example, it is also the case that no bonding pad for the contact-connection of the light-emitting diode chip is arranged at the radiation passage area; rather, said bonding pad is situated in the opening at the contact layer, that is to say below the radiation passage area.

In accordance with at least one embodiment of the light-emitting diode chip, the encapsulation layer comprises at least one of the following materials, that is to say that the encapsulation layer can consist of one of the following materials, contain one of the following materials or contain a combination of at least two of the following materials or consist of a combination of at least two of the following materials: TiN, TiWN, Pt, W, PtTiWN, Ti. By way of example, it is also possible for the encapsulation layer to be embodied in a multilayered fashion, wherein the encapsulation layer has, for example, at least one sublayer formed with TiWN and at least one sublayer formed with TiN. By way of example, a plurality of said sublayers can be arranged in an alternating order one above another.

In accordance with at least one embodiment of the light-emitting diode chip, an outer area of the encapsulation layer has traces of an etching method in places. That is to say that parts of the encapsulation layer are removed in the opening by means of an etching process. This is also a feature which relates to the product—the light-emitting diode chip—since the etching method can be detected by means of the traces that are characteristic of the etching method at the encapsulation layer.

In accordance with at least one embodiment of the light-emitting diode chip, the mirror layer contains silver or consists of silver. Silver is particularly sensitive to moisture; furthermore, positively charged silver ions tend, in the electric field that occurs during the operation of the light-emitting diode chip, toward migration into other regions of the light-emitting diode chip, where they can lead to damage, such as, for example, low-current weaknesses or short circuits. The encapsulation layer described here, which also encapsulates a side area of the mirror layer metallically, for example, therefore proves to be particularly advantageous.

Furthermore, a method for producing a light-emitting diode chip is specified. By way of example, a light-emitting diode chip described here can be produced by means of the method. That is to say that the features disclosed for the light-emitting diode chip are also disclosed for the method, and vice versa.

The method has the following steps, for example, wherein the specified order of the steps is advantageous in this case:

Firstly, a p-conducting region is provided. The p-conducting region can be grown for example epitaxially onto a growth substrate, for example in the following layer sequence: growth substrate, n-conducting region, active region, p-conducting region.

In a subsequent method step, a mirror layer is applied to an outer area of the p-conducting region, for example at that side of the p-conducting region which is remote from the active region.

After the application of the mirror layer or by means of a mask technique during the application of the mirror layer, an opening is produced in the mirror layer, which extends as far as the p-conducting region. That is to say that the mirror layer is removed in the region of the opening, such that the p-conducting region arranged below the mirror layer is uncovered.

Afterward, an encapsulation layer is applied to the bottom area of the mirror layer which is remote from the p-conducting region, and is introduced into the opening.

As a result, a later bottom area of the mirror layer which is remote from the p-conducting region, and also a side area of the mirror layer are covered with the encapsulation layer.

Afterward, a contact layer is applied to that side of the encapsulation layer which is remote from the mirror layer.

Finally, the contact layer is uncovered from that side of the p-conducting region which is remote from the contact layer in the region of the opening of the mirror layer. For this purpose, by way of example, material of the n-conducting region, of the active region, of the p-conducting region, of the mirror layer and of the encapsulation layer can be removed in places. In this case, the uncovering takes place in the region of the opening of the mirror layer in such a way that part of the encapsulation layer remains present at the side areas of the mirror layer, such that the side areas of the mirror layer remain completely covered by the material of the encapsulation layer.

The light-emitting diode chip described here and also the method described here for producing a light-emitting diode chip are explained in greater detail below on the basis of exemplary embodiments and the associated figures.

Figure 1H:
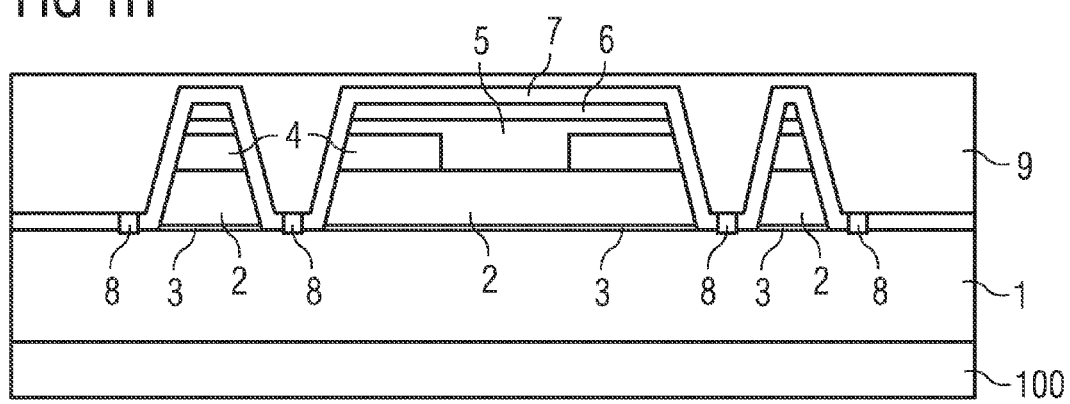
Figure 1I:
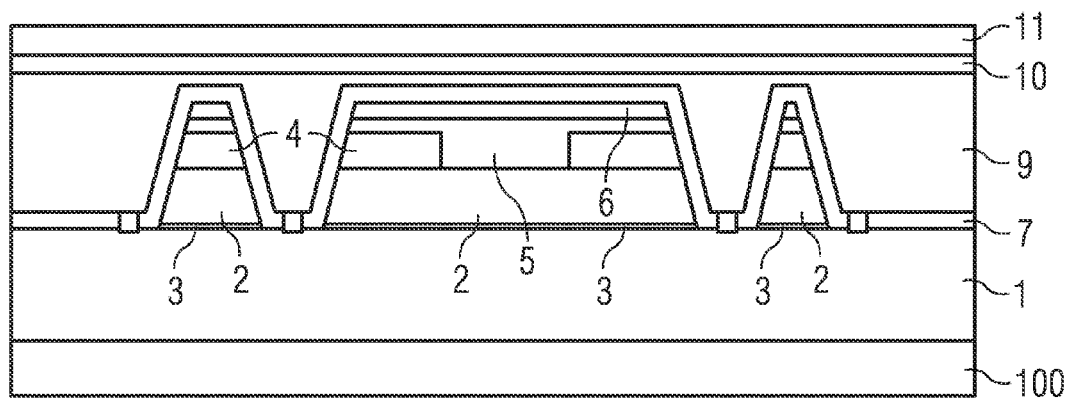
Figure 1J:
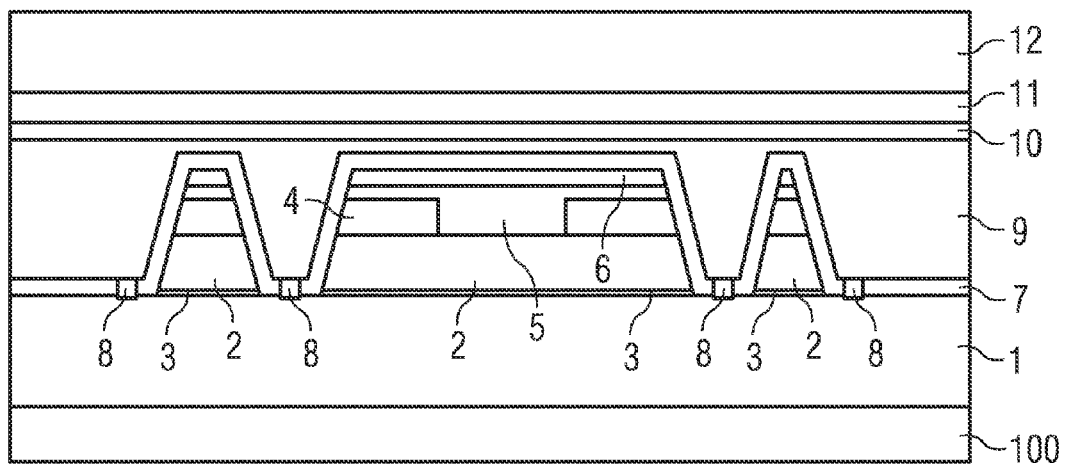
Figure 1K:
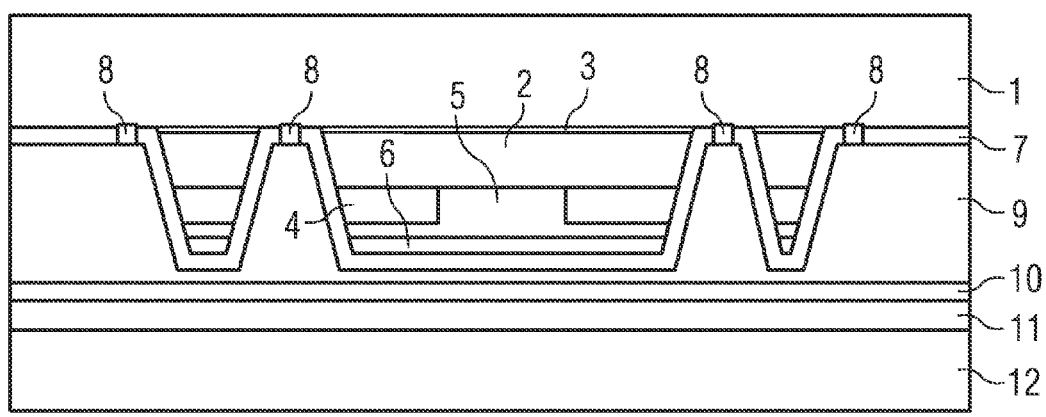
Figure 1L:
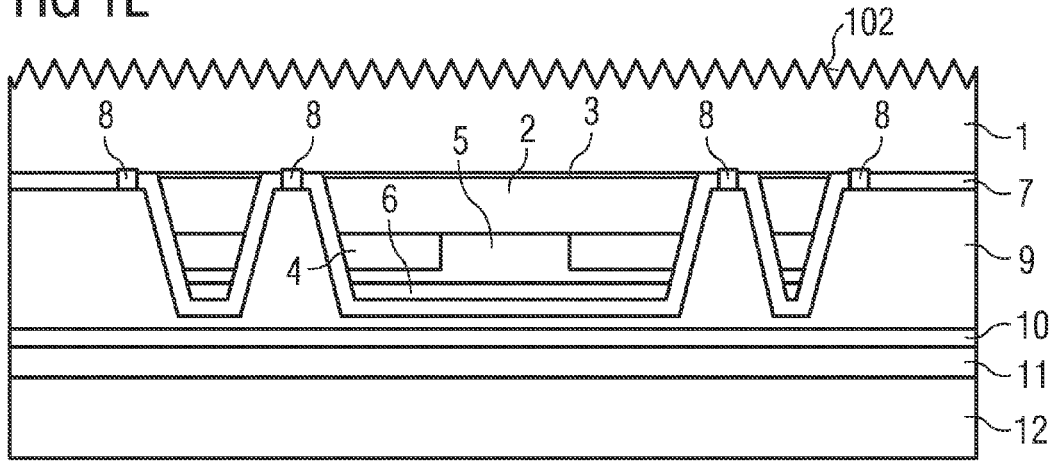
Figure 1M:
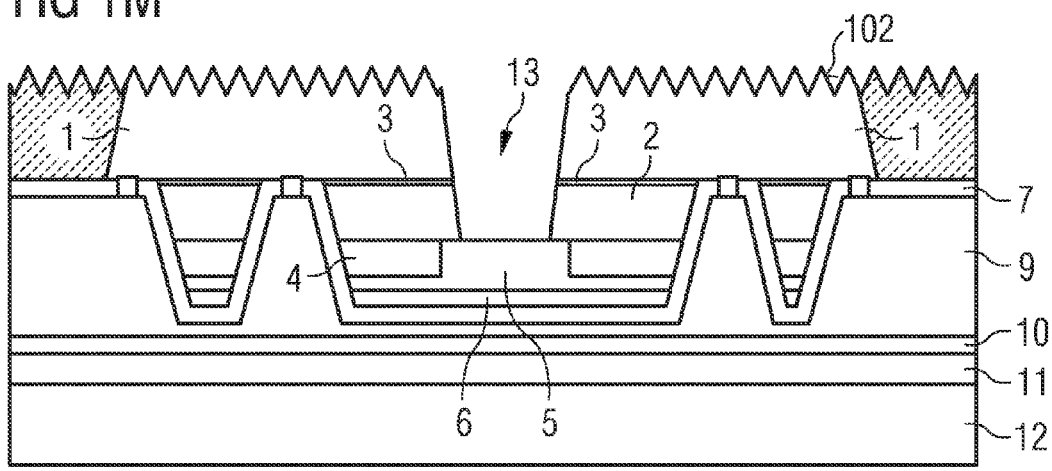
Figure 1N:
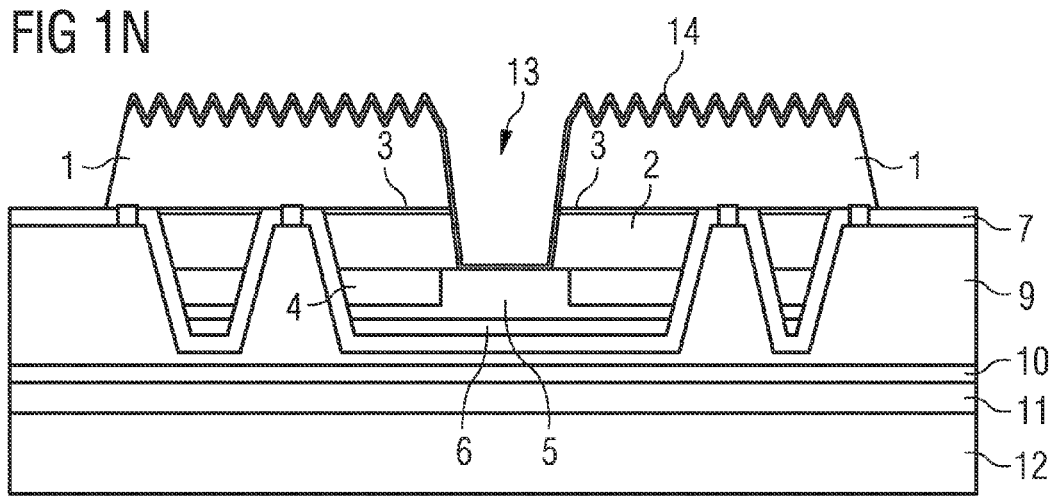
Figure 1O:
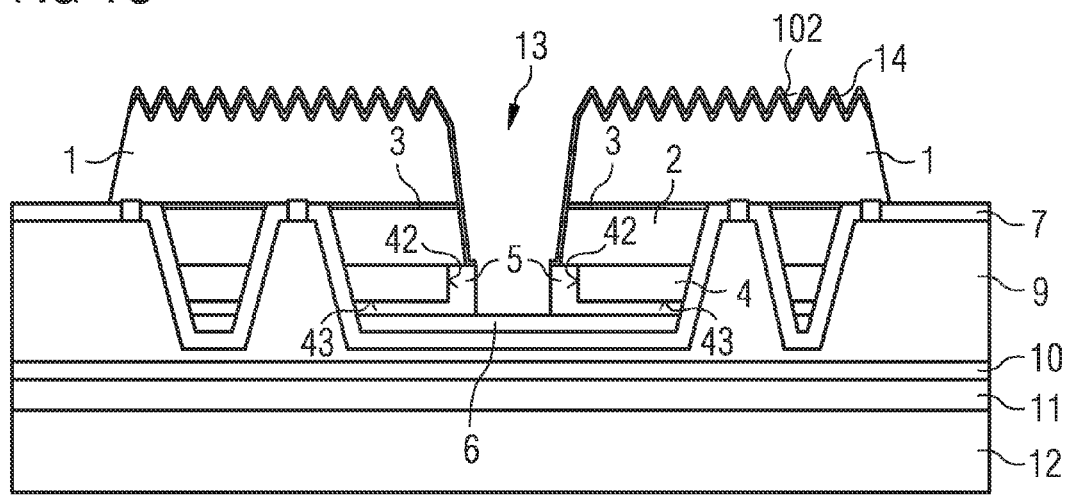
Figure 1P:
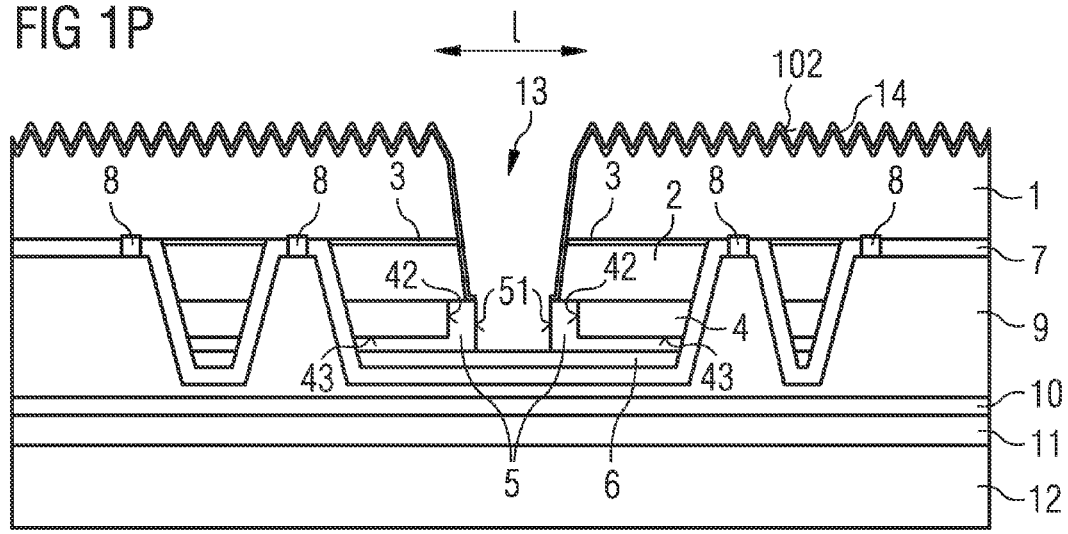

FIGS. 1A to 1P show schematic sectional illustrations for producing a light-emitting diode chip in accordance with example embodiments.

A method for producing a light-emitting diode chip described here is explained in greater detail on the basis of schematic sectional illustrations with reference to FIGS. 1A to 1P.

Elements that are identical, of identical type or act identically are provided with the same reference symbols in the figures. The figures and the size relationships of the elements illustrated in the figures among one another should not be regarded as to scale. But rather, individual elements can be illustrated with an exaggerated size in order to enable better illustration and/or in order to afford a better understanding.

FIG. 1P shows an exemplary embodiment of a light-emitting diode chip described here on the basis of a schematic sectional illustration.

The light-emitting diode chip comprises a carrier 12. The carrier 12 serves for mechanically stabilizing the layers of the light-emitting diode chip which are applied to it. In the present case the carrier is embodied in electrically conductive fashion.

The carrier 12 can be formed for example with a semiconductor material or a metal. By way of example, the carrier 12 contains or consists of one of the following materials: germanium, silicon, copper, nickel, molybdenum.

The carrier 12 is succeeded by a contact layer 11. The contact layer 11 contains gold, for example. An encapsulation layer 10 is arranged at that side of the contact layer 11 which is remote from the carrier 12, said encapsulation layer containing for example titanium, tungsten and/or a nitride, for example of said materials.

The metal layer 9 is formed at that side of the encapsulation layer 10 which is remote from the contact layer 11, said metal layer for example containing one of the following metals or consisting of one of the following metals: silver, gold.

In this case, it is possible for the contact layer 11 and the encapsulation layer 10 between the carrier 12 and the metal layer 9 to be formed by, for example, the following layer sequence: Ti/TiWN/TiPtAu. In this case, the titanium layer faces the metal layer 9 and proves to be particularly advantageous in particular in the case of a metal layer 9 composed of silver.

The light-emitting diode chip in accordance with FIG. 1P furthermore comprises an n-doped region 1, a p-doped region 2 and also an active zone 3, which is formed between the n-doped region 1 and the p-doped region 2. The active zone 3 serves for generating electromagnetic radiation during the operation of the light-emitting diode chip.

The mirror layer 4 is arranged at that side of the p-conducting region 2 which is remote from the n-conducting region. The mirror layer 4 is covered by an encapsulation layer 5 at its bottom area 43 remote from the p-conducting region 2, and also at its side areas 42 that are uncovered in the opening 13. The regions 1, 2 and 3 formed with a semiconductor material are based, for example, on the nitride compound semiconductor material described in greater detail above.

The mirror layer 4 is formed with silver, for example; the encapsulation layer 5 contains or consists of at least one of the following materials or material combinations: TiN, TiWN, Pt, W, PtTiWN, TCO (transparent conductive oxide)-materials like ITO or ZnO.

The contact layer 6 is adjacent to that side of the encapsulation layer 5 which is remote from the mirror layer, said contact layer being formed in the present case with aluminum or gold, for example.

The opening 13 in the light-emitting diode chip is formed into the semiconductor body, formed through the regions 1, 2 and 3 and also through the mirror layer 4 and the encapsulation layer 5, and the contact layer 6 is uncovered at its bottom area. Contact can be made there with the light-emitting diode chip by means of a contact wire, for example. The light-emitting diode chip is connected on the p side by means of the contact wire, for example. The light-emitting diode chip can have a further opening (not shown) from which the light-emitting diode chip can be electrically conductively connected on the n side.

In the present case, however, contact is made with the light-emitting diode chip through the carrier 12. For this purpose, contact regions 8 are formed, in which the metal layer 9 is in electrically conductive contact with the n-conducting region 1 of the light-emitting diode chip.

The contact regions 8 are formed in perforations through the passivation layer 7.

The passivation layer 7 contains silicon dioxide, for example, or consists thereof. The passivation layer 7 serves for electrically isolating the p-side contact layer 6 from the n-side contact layer 11.

In the present case, the encapsulation layer 5 completely covers the mirror layer 4 at its side areas 42 that are otherwise uncovered in the opening 13. In this case, the p-conducting region projects beyond the mirror layer 4 in a lateral direction 1 in the region of the opening 13. The cavity thus produced is filled with the encapsulation layer 5.

The encapsulation layer 5 extends from the side areas 42 along the bottom area 43 of the mirror layer 4 and in this way provides for protection of the mirror layer 4, for example against penetrating moisture.

The current distribution for operating the light-emitting diode chip is formed completely below the radiation passage area 102, which is situated at that side of the n-conducting region 1 which is remote from the carrier 12.

At least the regions of the light-emitting diode chip which are formed with a semiconductor material can be covered at their uncovered outer area by a further passivation layer 14, which, by way of example, consists of silicon oxide or silicon nitride and can be applied by means of a CVD method.

A method for producing a light-emitting diode chip described herein is explained in greater detail with reference to FIGS. 1A to 1P. In the method step in FIG. 1A, a p-conducting region 2 is provided. By way of example, the p-conducting region 2 is produced epitaxially. For this purpose, by way of example, an n-conducting region 1 can be deposited onto a growth substrate 100, which consists of sapphire, for example.

The active region 3 is formed onto the outer area of the n-conducting region 1 which is remote from the growth substrate 100, said active region being succeeded by the p-conducting region 2.

In the method step in FIG. 1B, the mirror layer 4 is applied, for example by vapor deposition, onto that side of the p-conducting region 2 which is remote from the growth substrate 100 at the outer area 21 of the p-conducting region 2. The mirror layer 4 consists of silver, for example.

Afterward, an opening 41 is produced in the mirror layer 4 for example by means of etching. The side area 42 or the side areas 42 of the mirror layer 4 and also the p-conducting region are uncovered in or at the opening 41. The outer area of the mirror layer 4 which lies opposite the p-conducting region 2 later forms the bottom area 43, FIG. 1C.

Afterward, the encapsulation layer 5, which is formed by a TiWN/TiN layer sequence, for example, is applied to the mirror layer 4, wherein the opening 41 is also filled, such that the side areas 42 of the mirror layer 4 are completely covered with the material of the encapsulation layer 5, FIG. 1D.

That side of the encapsulation layer 5 which is remote from the mirror layer 4 is succeeded by the contact layer 6, which, for example, alongside gold, can also contain Ti/Cr. In this case, the thickness of the contact layer 6 is chosen in such a way that the necessary current spreading is ensured in the later light-emitting diode chip, FIG. 1D.

A subsequent method step, FIG. 1E, involves patterning the encapsulation layer 5, the contact layer 6, the mirror layer 4 and also the p-conducting region 2 and the active region 3. By way of example, the layers 4, 5, 6 are patterned wet-chemically or by means of back-sputtering. A phototechnology is used for this purpose, for example. With the mask (not shown) used for this, the uncovered p-conducting region 2 is then neutralized or removed. This can be effected, for example, by means of Ar back-sputtering with or without the p-conducting region 2 being removed in places.

If the layers 4, 5, 6 are patterned wet-chemically, then the remaining patterned p-conducting region 2 projects beyond the mirror layer 4 in a lateral direction 1 by at least 1 μm, for example by approximately 2 μm.

In a subsequent method step, a passivation layer 7 is applied to the side remote from the growth substrate 100, which layer has a thickness of at least 400 nm, for example. The passivation layer 7 can be applied for example by means of a TEOS precursor that is used in a CVD process in order to improve the overmolding properties, in this respect cf. FIG. 1F.

Afterward, the passivation layer 7 is opened in places and the contact regions 8 are formed by introducing metal. In the finished light-emitting diode chip, the contact regions 8 form an n-type contact, which completely circumferentially encapsulates the active region 3 metallically. By way of example, for this purpose, silver can be introduced into the openings of the passivation layer 7, see FIG. 1G.

The method step in FIG. 1H involves applying the metal layer 9, which contains silver, for example, and which can be applied by means of evaporation, for example. The metal layer 9 completely covers the structures formed at the side remote from the growth substrate and therefore also serves for planarization.

The next method step, FIG. 1I, involves applying the further encapsulation layer 10 and the further contact layer 11 as described in conjunction with FIG. 1P.

Afterward, the carrier 12 is bonded on or deposited electrolytically, FIG. 1J.

In the subsequent method step, FIG. 1K, the growth substrate 100 is stripped away for example by means of a laser separating process or chemomechanically.

In order to improve the coupling-out of light from the light-emitting diode chip, the n-conducting region 1 can subsequently be roughened at the radiation passage area 102. This is done by means of KOH etching, for example, FIG. 1L.

The subsequent method step, FIG. 1M, involves producing the opening 13, which penetrates the n-conducting region 1, the active region 3 and also the p-conducting region 2. At the bottom area of the opening 13, the encapsulation layer 5 is initially uncovered. The opening 13 can be produced by means of hot $H_3PO_4$ which stops on the passivation layer 7 and the encapsulation layer 5. Furthermore, a mesa etch can be effected optionally, indicated by the dashed regions of the n-conducting region 1.

In the next method step, FIG. 1N, a further passivation layer 14 composed of silicon dioxide, for example, is applied by means of CVD.

In the method step in FIG. 1O, the encapsulation layer 5 is etched in the opening 13, such that the contact layer 6 is uncovered at the bottom area of the opening 13.

Finally, singulation into a multiplicity of light-emitting diode chips, FIG. 1P, is effected by means of laser separation, for example.

The invention is not restricted to the exemplary embodiments by the description on the basis of said exemplary embodiments. Moreover, the invention encompasses any novel feature and also any combination of features, which in particular includes any combination of features in the patent claims, even if this feature or this combination itself is not explicitly specified in the patent claims or exemplary embodiments.

This patent application claims the priority of German patent application 102010033137.6, the disclosure of content of which is hereby incorporated by reference.

The invention claimed is:

1. A light-emitting diode chip comprising:
    an n-conducting region;
    a p-conducting region;
    an active region between the n-conducting region and the p-conducting region;
    a mirror layer at a side of the p-conducting region which is remote from the active region;
    an encapsulation layer at a side of the mirror layer which is remote from the p-conducting region; and
    a contact layer at a side of the encapsulation layer which is remote from the mirror layer,
    wherein the encapsulation layer extends along a bottom area of the mirror layer which is remote from the p-conducting region and a side area of the mirror layer which runs transversely with respect to the bottom area,
    wherein the contact layer is freely accessible in places from its side facing the n-conducting region, and
    wherein an opening extends through the n-conducting region, the p-conducting region, the active region, the mirror layer and the encapsulation as far as to the contact layer.

2. The light-emitting diode chip according to the claim 1, wherein the opening is arranged in a central region of the light-emitting diode chip, such that the opening is surrounded in a lateral direction on all sides by the n-conducting region, by the p-conducting region, by the active region, by the mirror layer and by the encapsulation layer.

3. The light-emitting diode chip according to claim 1, wherein the side area of the mirror layer which faces the opening is completely covered by the encapsulation layer.

4. The light-emitting diode chip according to claim 1, wherein the p-conducting layer projects beyond the mirror layer in the region of the opening in a lateral direction.

5. The light-emitting diode chip according to claim 1, wherein the contact layer is wire-contact-connectable at least in places in the region of the opening.

6. The light-emitting diode chip according to claim 1, wherein the contact layer contains at least one of the following materials or consists of at least one of the following materials: Al, Au.

7. The light-emitting diode chip according to claim 1, comprising:
    a radiation passage area which is formed in places by an outer area of the n-conducting region which is remote from the p-conducting region, wherein
    a current distribution for energizing the active region during operation of the light-emitting diode chip is effected below the radiation passage area.

8. The light-emitting diode chip according to claim 1, wherein the encapsulation layer contains or consists of at least one of the following materials or combinations of at least two of the following materials: TiN, TiWN, Pt, W, PtTiWN.

9. The light-emitting diode chip according to claim 1, wherein an outer area of the encapsulation layer has traces of an etching method at least in places.

10. The light-emitting diode chip according to claim 1, wherein the mirror layer contains silver or consists of silver.

11. A method for producing a light-emitting diode chip comprising the following steps:
- providing a p-conducting layer;
- applying a mirror layer to an outer area of the p-conducting layer;
- producing an opening in the mirror layer, which extends as far as the p-conducting layer;
- applying an encapsulation layer to the bottom area of the mirror layer which is remote from the p-conducting layer, and into the opening;
- applying a contact layer to that side of the encapsulation layer which is remote from the mirror layer; and
- uncovering the contact layer from that side of the p-conducting layer which is remote from the contact layer in the region of the opening of the mirror layer.

12. The method according to the claim 11, wherein a light-emitting diode chip is produced, the light-emitting diode chip comprising:
- the n-conducting layer;
- the p-conducting layer;
- an active region between the n-conducting layer and the p-conducting layer;
- the mirror layer at a side of the p-conducting layer which is remote from the active region;
- the encapsulation layer at the side of the mirror layer which is remote from the p-conducting layer; and
- the contact layer at the side of the encapsulation layer which is remote from the mirror layer,
- wherein the encapsulation layer extends along the bottom area of the mirror layer which is remote from the p-conducting layer and a side area of the mirror layer which runs transversely with respect to the bottom area,
- wherein the contact layer is freely accessible in places from its side facing the n-conducting layer, and
- wherein the opening extends through the n-conducting layer, the p-conducting layer, the active region, the mirror layer and the encapsulation as far as to the contact layer.

13. A light-emitting diode chip comprising:
- an n-conducting region;
- a p-conducting region;
- an active region between the n-conducting region and the p-conducting region;
- a mirror layer at a side of the p-conducting region which is remote from the active region;
- an encapsulation layer at a side of the mirror layer which is remote from the p-conducting region; and
- a contact layer at a side of the encapsulation layer which is remote from the mirror layer,
- wherein the encapsulation layer extends along a bottom area of the mirror layer which is remote from the p-conducting region and a side area of the mirror layer which runs transversely with respect to the bottom area,
- wherein the contact layer is freely accessible in places from its side facing the n-conducting region, and
- wherein an outer area of the encapsulation layer has traces of an etching method at least in places.

* * * * *